US006979778B2

(12) United States Patent
Xiong et al.

(10) Patent No.: US 6,979,778 B2
(45) Date of Patent: Dec. 27, 2005

(54) FOOT PAD

(75) Inventors: Roger Xiong, Xing Ping (CN); Chi-Ren Hsueh, Xi Zhi (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 10/815,758

(22) Filed: Apr. 2, 2004

(65) Prior Publication Data

US 2005/0217879 A1    Oct. 6, 2005

(51) Int. Cl.[7] ............................................. H01J 15/00

(52) U.S. Cl. ............................ 174/50; 174/58; 174/62; 174/63; 174/158 R; 174/163 R; 248/687; 248/568; 248/614; 248/615; 248/634; 248/677; 248/163.1; 248/163.2; 248/188.8; 248/359.1; 248/676; 248/114; 248/128; 248/688

(58) Field of Search .............................. 174/50, 58, 62, 174/63, 158 R, 163 R; 248/687, 568, 614, 248/615, 634, 677, 163.1, 163.2, 188.8, 359.1, 248/676, 114, 128, 688

(56) References Cited

U.S. PATENT DOCUMENTS 3,704,848 A * 12/1972 Trebes et al. ............ 248/163.1
5,400,998 A * 3/1995 Ma ............................. 248/615

* cited by examiner

Primary Examiner—Dean A. Reichard
Assistant Examiner—Anton Harris
(74) Attorney, Agent, or Firm—Birch, Stewart, Kolasch & Birch, LLP

(57) ABSTRACT

A foot pad has an elastic conical body and at least one elastic rib. The elastic conical body defines a connecting surface and an outer conical surface. The connecting surface defines a hollow portion, and the elastic rib integrally connects to the elastic conical body at a surface of the hollow portion. The outer conical surface has a root portion connecting with an outer edge of the connecting surface. A thickness of the elastic conical body at the root portion of the outer conical surface is greater than a thickness of the elastic conical body at other portions of the outer conical surface. Elasticity of the foot pad is thereby increased so as to enlarge a contact area contacting an outer supporting surface, so that an anti-skid effect is improved and the foot pad is capable of absorbing a deformation of an electronic product.

9 Claims, 5 Drawing Sheets

FOOT PAD

BACKGROUND OF THE INVENTION

1. Field of the Invention

The present invention relates to a foot pad, and more particularly, to a foot pad being affixed to a consumer electronic product.

2. Background of the Invention

It is a well known that consumer electronic products play an important role in the modem life. For example, desktops or scanners are commonly used in homes and offices. A consumer electronic product symmetrically fixes some foot pads on a bottom thereof to provide an anti-skid effect to ensure stability when the electronic product used on a desk.

Referring to FIG. 1 to FIG. 3, a conventional foot pad 5 has an elastic conical body 50 made of natural rubber and having a solid structure. The elastic conical body 50 defines a connecting surface 51 and an outer conical surface 52. The outer conical surface 52 has a root portion 54 connecting with an outer edge of the connecting surface 51.

Referring to FIG. 4, the connecting surface 51 of the elastic conical body 50 is affixed to a bottom of an electronic product 80 by an adhesive means 70. The outer conical surface 52 of the elastic conical body 50 has an apex 55 for contacting an outer supporting surface 90.

Referring to FIG. 5, the electronic product 80 compresses the foot pad 5, such that the apex 55 of the outer conical surface 52 of the elastic conical body 50 is deformed to become a contact area A5 that contacts the outer supporting surface 90.

The deformation of the apex 55 is based on the elastic change of the material of the foot pad 5. The deformation of the apex 55 is small and limited because of the characteristics of the material. Therefore, the contact area A5 is small and cannot provide a proper anti-skid effect or stability when the electronic product 80 is used. Moreover, when the electronic product 80 is itself slightly deformed, and the foot pad 5 is unable to absorb the deformation of the electronic product 80.

Accordingly, as discussed above, the conventional foot pad still has some drawbacks that could be improved. The present invention aims to resolve the drawbacks in the prior art.

SUMMARY OF INVENTION

The primary object of the invention is therefore to specify a foot pad, such that the elasticity and the anti-skid effect of the foot pad are increased and the foot pad is capable of absorbing the deformation of an electronic product so as to ensure stability when using the electronic product.

According to the invention, the object is achieved via a foot pad comprising an elastic conical body and at least one elastic rib. The elastic conical body defines a connecting surface and the connecting surface defines a hollow portion. The elastic rib integrally connects to the elastic conical body at a surface of the hollow portion.

Because the hollow portion of the elastic conical body increases an elasticity of the foot pad and enlarges a contact area of the foot pad contacting against an outer supporting surface, an anti-skid effect of the foot pad is improved and the foot pad is capable of absorbing the deformation of an electronic product so as to ensure stability when using the electronic product.

The elastic conical body defines an outer conical surface and the outer conical surface has an apex for contacting an outer supporting surface. The outer conical surface has a root portion connecting with an outer edge of the connecting surface. A thickness of the elastic conical body at the root portion of the outer conical surface is larger than a thickness of the elastic conical body at the apex of the outer conical surface. The connecting surface is large, which allows the foot pad to affix firmly to the electronic product and provide a better supporting effect.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention which will be described hereinafter and which will form the subject of the claims appended hereto.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE EMBODIMENTS

Figure 1:
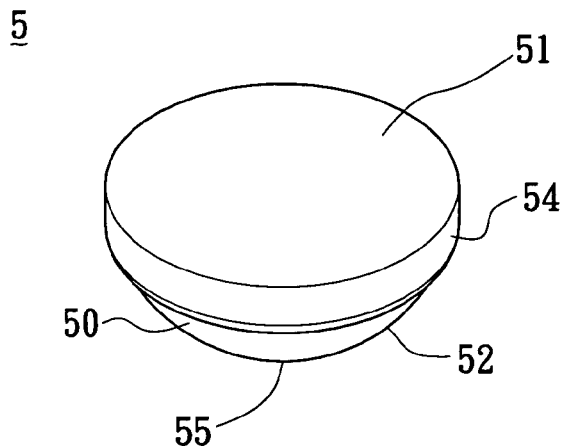
FIG. 1 is a perspective view showing a foot pad of the prior art.
Figure 2:
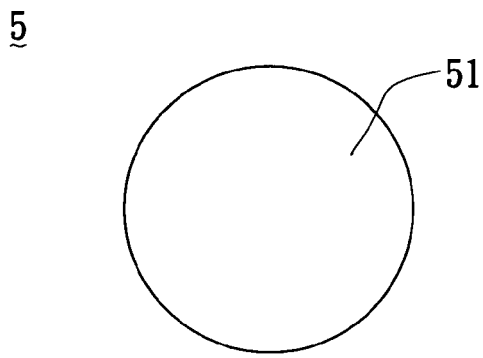
FIG. 2 is a top plan view showing the foot pad of the prior art.
Figure 3:
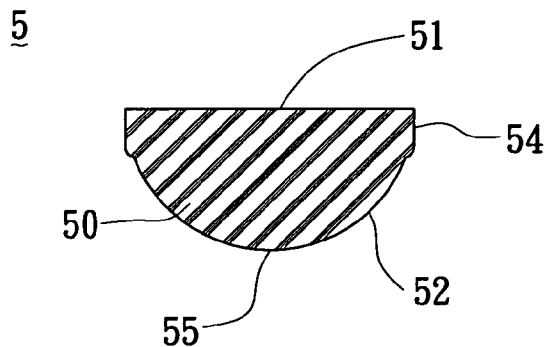
FIG. 3 is a cross-sectional view showing the foot pad of the prior art.
Figure 4:
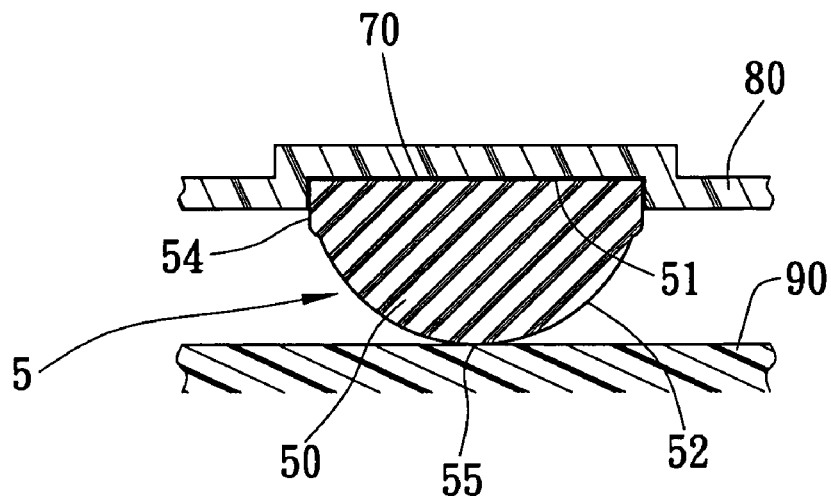
FIG. 4 is a cross-sectional view showing the foot pad of the prior art applied to an electronic product before deformation.
Figure 5:
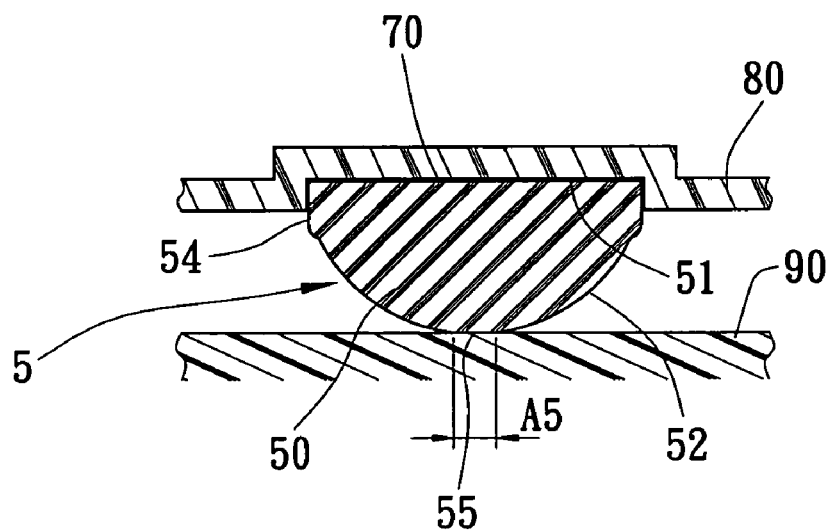
FIG. 5 is a cross-sectional view showing the foot pad of the prior art applied to the electronic product when deformed.
Figure 6:
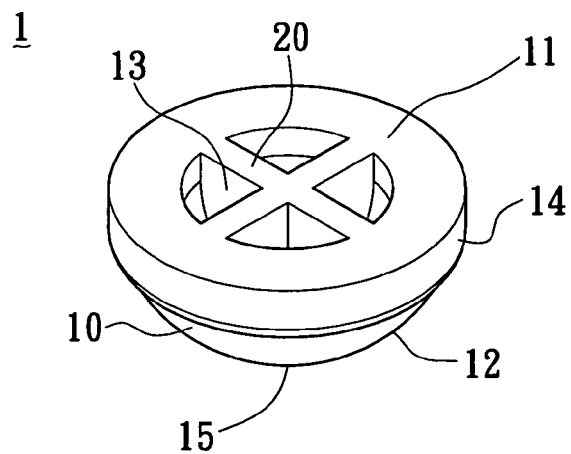
FIG. 6 is a perspective view showing a first embodiment of a foot pad of the present invention.
Figure 7:
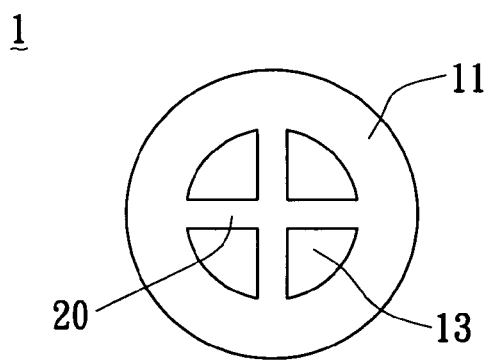
FIG. 7 is a top plan view showing the first embodiment of the foot pad of the present invention.
Figure 8:
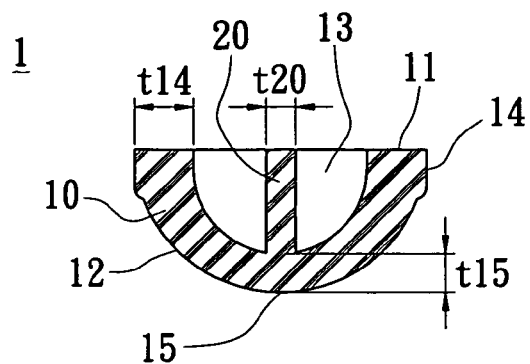
FIG. 8 is a cross-sectional view showing the first embodiment of the foot pad of the present invention.

FIG. 6 to FIG. 8 illustrate a first embodiment of the present invention. The present invention provides a foot pad 1. The foot pad 1 comprises an elastic conical body 10 and at least one elastic rib 20.

The elastic conical body 10 defines a connecting surface 11 and an outer conical surface 12. The connecting surface 11 defines a hollow portion 13 and the outer conical surface 12 has a root portion 14 connecting with an outer edge of the connecting surface 11. In this embodiment, the outer edge of the connecting surface 11 is a circle, but can also be an oval or other different shapes. A thickness t14 of the elastic conical body 10 at the root portion 14 of the outer conical surface 12 is larger than a thickness t15 of the elastic conical body 10 at an apex 15 of the outer conical surface 12.

Each of the elastic ribs 20 integrally connects to the elastic conical body 10 at a surface of the hollow portion 13. In this embodiment, the elastic ribs 20 are arranged perpendicular to each other. The thickness t14 of the elastic conical body 10 at the root portion 14 of the outer conical surface 12 is larger than a thickness t20 of each of the elastic ribs 20. The elastic conical body 10 and the elastic ribs 20 are made of silicone for better elasticity. The elastic conical body 10 and the elastic ribs 20 can also be made of other materials with elasticity, such as natural rubber.

Figure 9:
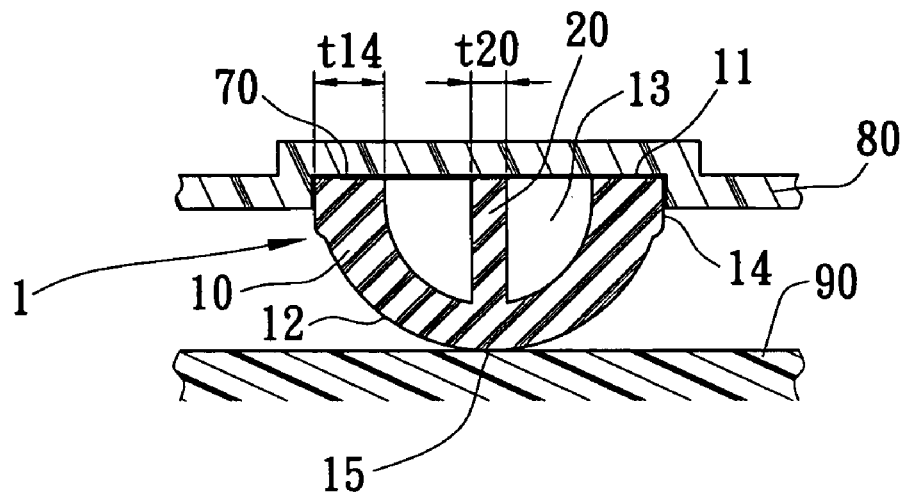
FIG. 9 is a cross-sectional view showing the first embodiment of the foot pad applied to an electronic product before deformed of the present invention.

Referring to FIG. 9, the connecting surface 11 of the elastic conical body 10 is affixed to a bottom of an electronic product 80 by an adhesive means 70. The apex 15 of the outer conical surface 12 of the elastic conical body 10 is for contacting an outer supporting surface 90.

Figure 10:
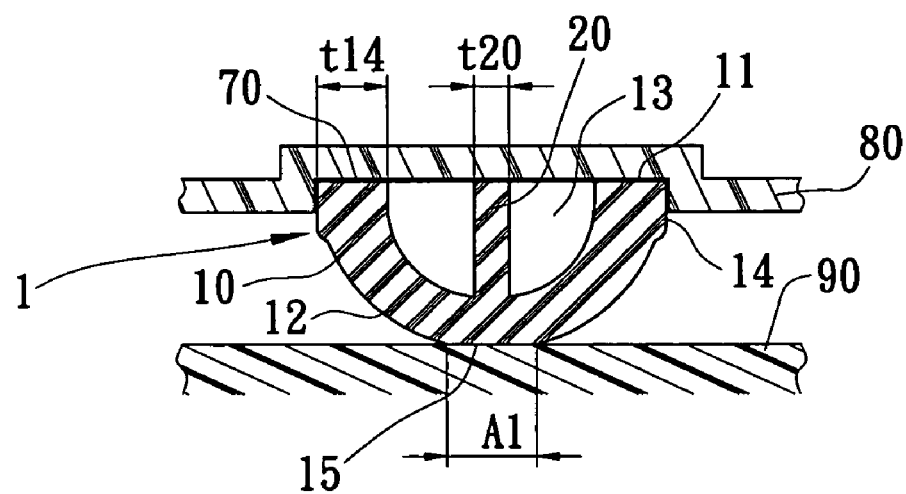
FIG. 10 is a cross-sectional view showing the first embodiment of the foot pad applied to the electronic product when deformed of the present invention.

Referring to FIG. 10, the electronic product 80 compresses the foot pad 1, such that the apex 15 of the outer conical surface 12 of the elastic conical body 10 is deformed to become a contact area A1 that contacts against the outer supporting surface 90. The deformation of the apex 15 is enlarged and the elasticity of the foot pad 1 increases not only because of the elastic change of the material of the foot pad 1 but also the hollow portion 13 of the elastic conical body 10. Therefore, the contact area A1 is enlarged so as to provide a better anti-skid effect for the electronic product 80 and a better stability when using the electronic product 80. Additionally, when the electronic product 80 is itself slightly deformed, the foot pad 1 is capable of absorbing the deformation of the electronic product 80 so as to ensure the stability when using the electronic product 80.

Moreover, because the thickness t14 of the elastic conical body 10 at the root portion 14 of the outer conical surface 12 is large, the connecting surface 11 is resultantly large, which allows the foot pad 1 to be affixed firmly to the electronic product 80 for a better supporting effect.

Figure 11:
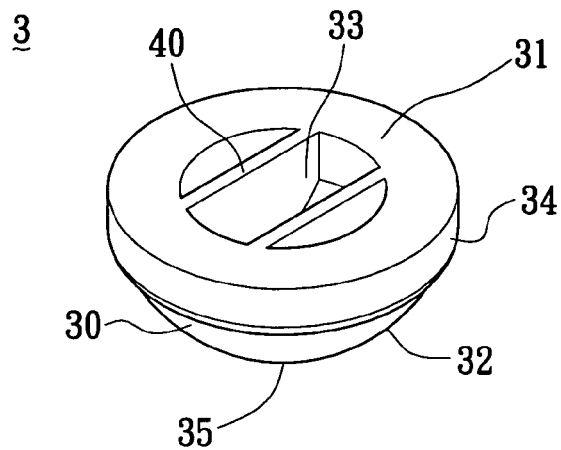
FIG. 11 is a perspective view showing a second embodiment of a foot pad of the present invention.
Figure 12:
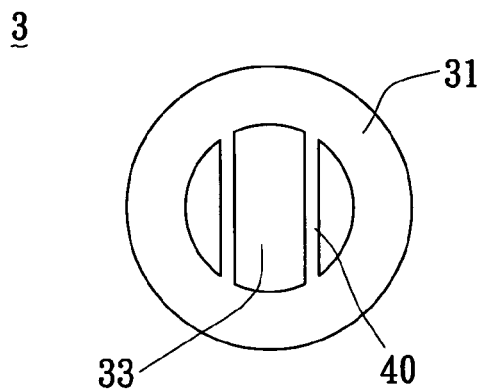
FIG. 12 is a top plan view showing the second embodiment of the foot pad of the present invention.
Figure 13:
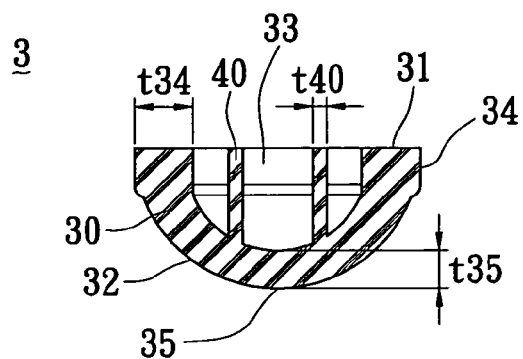
FIG. 13 is a cross-sectional view showing the second embodiment of the foot pad of the present invention.

FIG. 11 to FIG. 13 illustrate a second embodiment of the present invention. Each of the elastic ribs 40 integrally connects to the elastic conical body 30 at a surface of the hollow portion 33. In this embodiment, the elastic ribs 40 are arranged in a parallel manner. The outer conical surface 32 of the elastic conical body 30 has an apex 35 for contacting an outer supporting surface (not shown). The outer conical surface 32 of the elastic conical body 30 has a root portion 34 connecting with an outer edge of the connecting surface 31. The thickness t34 of the elastic conical body 30 at the root portion 34 of the outer conical surface 32 is larger than a thickness t35 of the elastic conical body 30 at the apex 35 of the outer conical surface 32 and is larger than a thickness t40 of each of the elastic ribs 40. The elasticity of the foot pad 3 increases and the contact area is enlarged, so that the anti-skid effect is improved and the foot pad 3 is capable of absorbing the deformation of the electronic product 80. Additionally, the connecting surface 31 is large to provide a better supporting effect for the electronic product 80.

As indicated above, the foot pad of the present invention has the following advantages:

(1) The hollow portion of the elastic conical body increases the elasticity of the foot pad and enlarges the contact area deformed at the apex of the outer conical surface contacting the outer supporting surface, so that the anti-skid effect of the foot pad is improved and the foot pad is capable of absorbing the deformation of the electronic product so as to ensure stability when the electronic product is used.

(2) The thickness of the elastic conical body at the root portion of the outer conical surface is large, so the connecting surface is large, which allows the foot pad to be firmly affixed to the electronic product for better support.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A foot pad, comprising:
an elastic conical body, the elastic conical body being readily deformable, the elastic conical body having a connecting surface and a hollow portion, the elastic conical body being without any protrusion extending above the connecting surface, the connecting surface being at a top of the elastic conical body, the hollow portion being surrounded by an inner surface of the elastic conical body, a top of the hollow portion being surrounded by an inner circumference of the connecting surface; and
at least one elastic rib, the at least one elastic rib being readily deformable, the at least one elastic rib integrally connecting to the inner surface of the elastic conical body.

2. The foot pad as claimed in claim 1, wherein the elastic conical body defines an outer conical surface, the outer conical surface having an apex for contacting an outer supporting surface and a root portion connecting with an outer edge of the connecting surface, wherein a thickness of the elastic conical body at the root portion of the outer conical surface is greater than a thickness of the elastic conical body at the apex of the outer conical surface.

3. The foot pad as claimed in claim 1, wherein the elastic conical body defines an outer conical surface, the outer conical surface having an apex for contacting an outer supporting surface and a root portion connecting with an outer edge of the connecting surface, wherein a thickness of the elastic conical body at the root portion of the outer conical surface is greater than a thickness of the elastic rib.

4. The foot pad as claimed in claim 1, wherein the elastic ribs are arranged perpendicular to each other.

5. The foot pad as claimed in claim 1, wherein the elastic ribs are arranged parallel to each other.

6. The foot pad as claimed in claim 1, wherein the elastic conical body and the elastic ribs are made of silicone.

7. The foot pad as claimed in claim 1, wherein the elastic conical body and the elastic ribs are made of natural rubber.

8. The foot pad as claimed in claim 1, wherein the at least one elastic rib transversely crosses the entire hollow portion and contacts the inner surface of the elastic conical body.

9. The foot pad as claimed in claim 8, wherein two ends of the at least one elastic rib contact the inner circumference of the connecting surface.

* * * * *